United States Patent [19]

Fraser et al.

[11] 4,072,768
[45] Feb. 7, 1978

[54] METHOD FOR MAKING PATTERNED GOLD METALLIZATION

[75] Inventors: David Bruce Fraser, Berkeley Heights; Guenther Wilhelm Kammlott, Watchung, both of N.J.

[73] Assignee: Bell Telephone Laboratories, Incorporated, Murray Hill, N.J.

[21] Appl. No.: 651,634

[22] Filed: Jan. 23, 1976

[51] Int. Cl.² .............................................. H05K 1/00
[52] U.S. Cl. ........................................ 427/34; 427/43; 427/53; 427/96; 427/99; 427/125; 96/88; 204/192 C; 427/259
[58] Field of Search .................. 427/43, 53, 96, 99, 427/259, 271, 272, 282, 287, 54, 35, 36, 259, 229; 96/36.2, 88

[56] References Cited

U.S. PATENT DOCUMENTS

| | | | |
|---|---|---|---|
| 3,256,109 | 6/1966 | Berger | 427/53 X |
| 3,281,264 | 10/1966 | Cape et al. | 427/229 |
| 3,529,961 | 9/1970 | Schaefer et al. | 96/36.2 |
| 3,684,569 | 8/1972 | Milgram | 96/36.2 |
| 3,762,938 | 10/1973 | Ridenour et al. | 427/54 X |
| 3,904,783 | 9/1975 | Nara et al. | 96/36.2 X |
| 3,930,963 | 1/1976 | Polichette et al. | 96/36.2 X |
| 4,009,297 | 2/1977 | Redmond et al. | 427/54 |

*Primary Examiner*—Ralph S. Kendall
*Attorney, Agent, or Firm*—Peter V. D. Wilde

[57] ABSTRACT

A method is disclosed for making patterned gold films in the manufacture of integrated circuit devices. The method calls for the deposition of a film of a gold compound whose heat of formation is in the range of from $-20$ to $+10$ Kcal/mole, selectively reducing the gold compound to elemental gold by irradiation, and chemically removing the unreduced portions of the gold compound.

12 Claims, 4 Drawing Figures

4,072,768

METHOD FOR MAKING PATTERNED GOLD METALLIZATION

BACKGROUND OF THE INVENTION

1. Field of the Invention

The invention is concerned with the fabrication of integrated circuits.

2. Description of the Prior Art

Deposition and patterning of thin films of metals such as aluminum, gold, titanium and platinum on semi-conducting and insulating substrates are essential processes in the manufacture of integrated circuit devices. Deposition of metallic layers may be carried out directly by vapor deposition in a vacuum, and patterning by depositing on the metallic film an organic photoresist mask followed by chemical etching. To etch a pattern in a layer of gold by this method it is necessary to use aqua regia as an etchant which, however, tends to lift the photoresist material form the gold layer. As a consequence, pattern definition suffers.

A method specifically directed to making a patterned gold film was described in U.S. Pat. No. 3,684,569, issued to A. A. Milgram on Aug. 15, 1972. Milgram proposes the use of ultraviolet light to selectively influence the hardening of a deposited film of gold resinate, removal of exposed portions of the film by means of a solvent such as nitric acid, and heat fusing the patterned gold resinate to metallic gold. Another method is described in U.S. Pat. No. 3,056,881, issued to H. J. Schwarz on Oct. 2, 1962. Schwarz proposes to delineate a pattern in a layer of a tightly bound metal oxide such as $Al_2O_3$ by means of a programmed electron beam and in the presence of a reducing agent, thereby locally reducing the metal oxide to elemental metal.

It has been ascertained, however, that $Al_2O_3$ cannot be reduced by electron irradiation at practically feasible energy levels. It has been further ascertained that metal oxides which are susceptible to reduction of the metallic state by electron irradiation are likely to dissociate under conditions occurring during the operation of integrated circuit devices. Consequently, the mere delineation of a metallic pattern in a film of a compound susceptible to reduction by electrons does not yield practically useful devices.

SUMMARY OF THE INVENTION

The invention is a method for making a patterned layer of gold metal on a substrate. The method calls for depositing a gold compound whose heat of formation is in the range of from $-20$ to $+10$ Kcal/mole on the substrate, patterning the deposited layer by selective irradiation and chemically removing the unreduced portions of the layer.

DETAILED DESCRIPTION

1. The Figures

Figure 1:
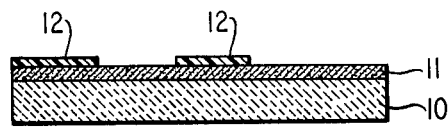
FIGS. 1–4 are schematic cross sections of an integrated circuit device at distinct stages of the claimed process.

FIG. 1 shows substrate 10, gold compound layer 11, and mask 12.

Figure 2:
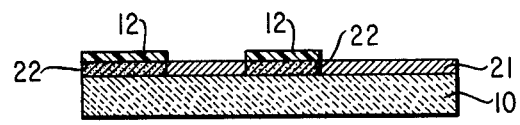

FIG. 2 shows substrate 10, areas of elemental gold 21 and areas of gold compound 22 and photomask 12.

Figure 3:
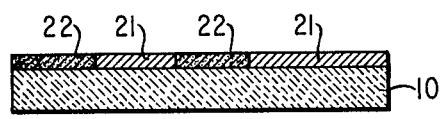

FIG. 3 shows substrate 10, areas of elemental gold 21 and areas of gold compound 22.

Figure 4:
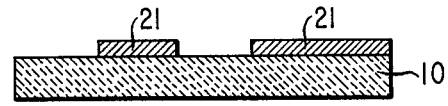

FIG. 4 shows substrate 10 and areas of elemental gold 21.

2. The Method

To ensure proper adherence of the gold compound to the surface of the substrate, the surface should be free from contamination such as dust or organic substances; standard cleaning procedures may be used for this purpose such as cleaning by acidic solutions, organic solvents and water rinses. After cleaning, the substrate is thoroughly dried, for example, by spinning in or exposure to a stream of air or nitrogen. On the cleaned substrate a gold compound such as, for example, gold oxide, gold iodide or gold bromide, is deposited by sputtering, plasma deposition, brushing or spraying in solution, or evaporation of gold in a reactive ambient.

The heat of formation of the gold compound used should preferably lie within the limits of from $-20$ to $+10$ Kcal/mole. Compounds having a heat of formation of less than $-20$ Kcal/mole are too tightly bound for reduction by irradiation; compounds having a heat of formation in excess of $+10$ Kcal/mole are too unstable for processing under ambient conditions.

The thickness of the deposit should advantageously amount to at least 0.1 micrometer to ensure adequate coverage of the substrate but should not exceed 5.0 micrometers in the interest of preservation of raw materials. Following deposition the layer of gold compound is patterned by exposure to large aperture light or electron radiation in the presence of a photoresist, electron resist, or X-ray resist mask applied to the gold compound film. Alternatively, the pattern may be directly delineated by a laser beam or a focused electron beam under program control.

In either case areas of the gold compound film reached by a sufficient amount of energy are reduced to areas of metallic gold whereas the remaining portions of the film remain unreduced. Depending on the gold compound, irradiation may be beneficially carried out in air, in a vacuum, in an inert atmosphere such as nitrogen, or in a reducing atmosphere such as hydrogen. After patterning by selective irradiation the remaining unreduced portions of the gold compound are removed by exposure of the entire layer to a suitable chemical agent such as water or hydrochloric acid.

EXAMPLE 1

A layer of gold oxide 0.1 micrometer thick is deposited on a glass substrate by reactive sputtering using a gold cathode and essentially pure oxygen as sputter gas. Sputtering is carried out in a magnetron type sputter apparatus to prevent a flux of charged particles from the cathode to the substrate which would dissociate the gold oxide being deposited. A pattern having a line width of four micrometers is delineated by a focused electron beam of 30 K volts electron energy and an electron current of $5 \times 10^{-7}$ amperes. The beam is moved across the substrate at a speed of 2mm/sec. After patterning, the remaining unreduced gold oxide is dissolved by dipping in hydrochloric acid.

EXAMPLE 2

A gold bromide layer 0.01 micrometer thick is deposited on a substrate by sputtering gold through vaporized bromine in a magnetron type sputter apparatus. After application of a photoresist mask the portions of the gold bromide layer underlying the translucent areas of the mask are reduced to elemental gold by exposure to wide-aperture electron radiation. The photoresist is then removed, e.g., by exposure to an oxygen plasma, and the remaining gold bromide washed away by rinsing in water.

Microscopic examination showed the edges of patterns made by the disclosed method to be precise to within 0.2 micrometer.

What is claimed is:

1. A method for making a gold pattern on a substrate, comprising the steps of (1) depositing on said substrate a layer consisting essentially of gold oxide, said layer having a thickness in the range of from 0.01 to 5.0 micrometers, (2) patterning said layer by selectively reducing portions of said layer to metallic gold by irradiation of said portions with electrons or light, and (3) exposing the entire layer to a chemical agent whereby the unreduced portions of said layer are removed.

2. Method of claim 1 in which said layer is deposited by sputtering.

3. Method of claim 1 in which said layer is deposited by plasma deposition.

4. Method of claim 1 in which said layer is deposited by evaporation of gold in a reactive ambient.

5. Method of claim 1 in which said irradiation is carried out by means of a focused electron beam.

6. Method of claim 1 in which said irradiation is carried out by means of a laser beam.

7. Method of claim 1 in which said patterning is carried out by depositing a mask on said layer and exposing the resulting assembly to wide aperture electron radiation.

8. Method of claim 1 in which said patterning is carried out by depositing a mask on said layer and exposing the resulting assembly to wide aperture light radiation.

9. Method of claim 1 in which said chemical agent is hydrochloric acid.

10. Method of claim 1 in which said patterning is carried out in the presence of air or of an inert atmosphere.

11. Method of claim 1 in which said patterning is carried out in the presence of a vacuum or of a reducing atmosphere.

12. Method of claim 11 in which said reducing atmosphere is hydrogen.

* * * * *